Figure 1:
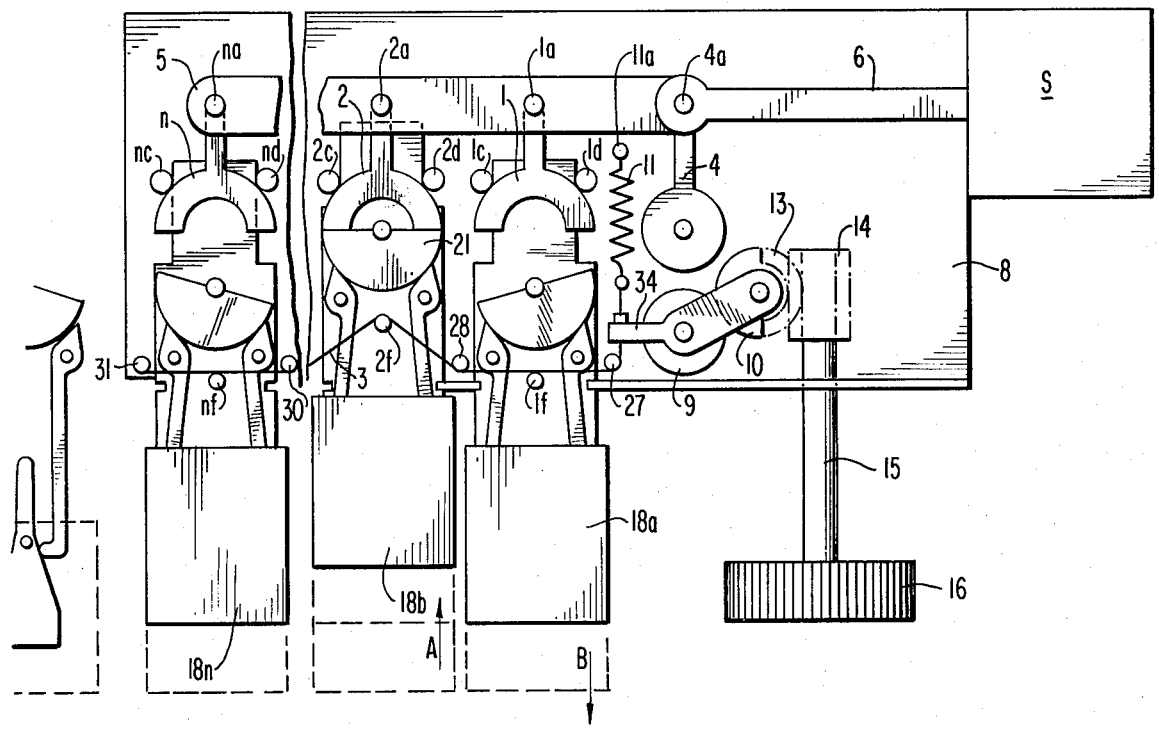

United States Patent [19]

Antonello

[11] 4,231,263
[45] Nov. 4, 1980

[54] MANUAL AND AUTOMATIC CONTROL DEVICE FOR ELECTRONIC EQUIPMENT AND OTHERS

[76] Inventor: Luis M. Antonello, via XXI Aprile, 12, Rome, Italy

[21] Appl. No.: 428,952

[22] Filed: Dec. 27, 1973

[30] Foreign Application Priority Data

Dec. 29, 1972 [IT] Italy .............................. 55132 A/72

[51] Int. Cl.$^2$ ..................... F16H 35/18; H01H 9/26; H03J 5/06
[52] U.S. Cl. ................................. 74/10.33; 74/10.35; 74/10.37; 74/568 R; 74/568 M; 200/5 A; 200/5 E; 334/7
[58] Field of Search ............. 74/10.33, 483 PB, 10.27, 74/10.29, 10.31, 10.35, 10.37, 568 M, 568 R; 137/637.1; 200/5 A, 5 E, 5 EA; 334/7

[56] References Cited

U.S. PATENT DOCUMENTS

| Re. 22,634 | 4/1945 | Plensler | 74/10.33 |
| 2,266,712 | 12/1941 | Crosby | 74/10.33 |
| 2,344,091 | 3/1944 | Kirk | 74/10.33 X |
| 2,346,399 | 4/1944 | Schwarz et al. | 74/10.33 |
| 2,351,443 | 6/1944 | Metcalfe et al. | 74/10.33 |
| 2,531,457 | 11/1950 | McLarn | 200/5 E X |
| 3,247,728 | 4/1966 | Wolf et al. | 74/10.33 |
| 3,746,802 | 7/1973 | Sandi et al. | 200/5 E |
| 3,863,509 | 2/1975 | Zimatore et al. | 74/10.33 |

*Primary Examiner*—Leslie Braun
*Attorney, Agent, or Firm*—Berman, Aisenberg & Platt

[57] ABSTRACT

A mechanical memory device comprising (a) a bar, (b) means supporting the bar for substantially linear movement, (c) input means for linearly moving the bar to plural selected positions, and (d) plural bar position sensing and actuating means, each having means for sensing a selected position of the bar, for storing the sensed bar position and for actuating the bar to cause it to occupy the position thereof corresponding to the stored position.

17 Claims, 3 Drawing Figures

MANUAL AND AUTOMATIC CONTROL DEVICE FOR ELECTRONIC EQUIPMENT AND OTHERS

DESCRIPTION

The present invention relates to a particular type of mechanical memory equipment provided to solve problems which are continuously present in the field of mechanics, electro-mechanics, pneumatics and electronics, having a wide range of practical uses.

The herein disclosed device or system differs from other systems, where precision does not reach the maximum and where dimensions are substantial and which are uneconomic; by the present invention such disadvantages are definitely overcome resulting in both greater precision and also in greater economy.

The equipment of the present invention enables the storing of an position of one of the infinite number of points of a given segment in the case of linear shifting; and one of an infinite number of angles of a given arc in the case of radial shifting. The selection of those points may occur by manually activating a knob or by pushing one of "n" digital keys. The present invention device or system is applicable to various mechanical, electronic, electrical, pneumatic apparatus, where it may be used, and an example, without limiting any application of the invention, or its function is given in connection with the regulation of a valve or tuner which allows or impedes the output of a signal. The work conditions may vary from one extreme to the other, in other words the tube may be completely closed, completely open or may assume any given intermediate position.

The system which is the object of the present invention allows total control of the valve either by operating the control knob of the valve, or, having stored particular work positions of the valve, recalling them—immediately—by pushing one of the "n" digital keys regardless of the manual storing. The ability of any single digital key to cancel previous stored information in order to store other information is a fundamental part of the invention system.

Referring to FIG. 1, the construction of an embodiment of the invention is illustrated, which is basically composed of a chassis (8) on which are pivoted the levers (1), (2), ("n"), each having straight first arms and second arcuate arms the pins (1c-1d), (2c-2d), ("n"c–"n"d), which engage the arcuate surfaces on the outside of the second arms and which allow the levers to rotate for only 30° in both directions. The ends of the second arms have transverse faces.

Lever (4) is different from the others. It is located at and pivoted to the end of the transverse bar 5, to which are also pivoted first arms of the other levers (1), (2), ("n"), through pins (1a), (2a), ("n"a), (4a); furthermore on pin (4a) is also pivoted an arm (6) which is connected at its right end with the valve, tuner or other device. It is thus emphasized, that the assembly acts as a parallelogram, because for any angular displacement of the lever (4), there corresponds an equal angular displacement of all the levers.

Lever (4) may be rotated by a clutch system (9) (10), normally held in contact with it by counter spring (11). The wheel (10) is connected through its geared right semicircle portion (13) to the worm (14) coaxial to the input shaft (15) of the input knob (16). By rotating the knob (16) to the right or to the left, the wheel (10) and wheel (9) rotate (4), thereby determining its righthand or lefthand rotation, and consequently the simultaneous rotation of the levers (1), (2), ("n").

Figure 2:
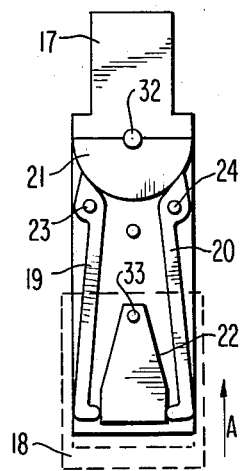
Figure 3:
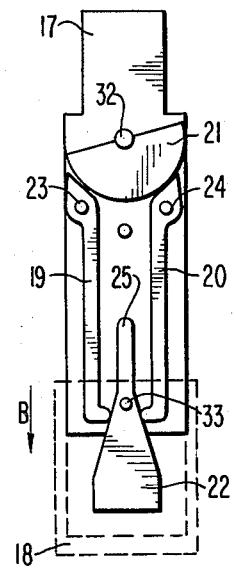

On the chassis (8) are, in correspondence to levers (1), (2), ("n"), an equal number of reciprocatable support members (17) on which are mounted for reciprocation the cap-like actuator (18), FIGS. 1-2-3, and which carry locking levers (19) and (20) pivoted on pins 23 and 24, and the cam (21) pivoted on pin (32) having an axis perpendicular to the plane of bar (5). The wedge (22) pivoted on actuator (18) by pin (33). The cam (21) is provided with a transverse face to sense and store the position of the corresponding lever (1,2,n,) particularly the transverse face at the ends of the second arms of said levers. The actuator 18 performs the function of locking cam (21) in a selected position by the shifting of wedge (22) to a position between the two levers (19) and (20), resulting in the spreading by flexing of levers (19) and (20) with consequent locking of cam (21) by forcing the faces of the locking levers (19) and (20) which are adjacent the pins (23) and (24) into locking engagement with the arcuate face of the position-storing cam (21).

The reciprocatable support members (17), which may be guided by the guide pins (1c), (1d), (2c), (2d), etc., have pins (1f), (2f), (nf) extending upwardly therefrom. A flexible thread or cord (3), as of Nylon, has one end fastened to the arm (34). A spring (11), anchored to pin (11a), is fastened to arm (34). The cord (3) passes around pin (27), and thence across pins (27), (28) and (30), being fastened to pin (31). The pins (1f), (2f), (nf) each will cause a deflection of the cord (3) (see pin (2f) in FIG. 1), thereby causing axial movement of the end portion of cord (3) between pin (27) and arm (34). This will move arm (34) against the urging of spring 11 to disengage wheel (9) from lever (4).

The device operation, if lever (4) acts as control part on a valve, tuner, potentiometer or any other component to be controlled, is as follows: by rotating knob (16) shaft (15) turns worm (14) to drive geared portion (13) of wheel (10), and the wheel (9) to give an angular displacement of lever (4) and consequently a proportional shifting of transverse bar (5) and arm (6), as well as a similar displacement of levers (1), (2), ("n"). If no force acts to dispace the pin "n" a towards the actuator 18, the back, arcuate surfaces of the second arcuate arm of lever "n" may remain in engagement with pins "n"c and "n"d, with the corresponding second arcuate arms of the other levers similarly remaining in engagement with the corresponding pins; however, there may be disengagement of the second arcuate arms with the noted pins. In the case where any position of bar (5) is chosen to be stored, "n" digital keys are available which allow "n" stores in "n" different positions of bar (5) within the limits of its displacement. All of the above may be realized as to the "n" intermediate positions of bar (5) corresponding to "n" angular positions for the "n" levers of the digital keys.

For instance, if the bar (5) is in the position shown in FIG. 1 and it is desired to return it to the position shown in FIG. 1 each time actuator (18b), is pushed, the storing of such position is then carried out by pulling the actuator (18b) in the direction of arrow B so that wedge (22) FIG. 2, integral with actuator (18b) and guided by slot (25), is moved to the position of FIG. 3, thereby releasing the cam (21) which will be now free to rotate. Now by pushing actuator (18b) in the opposite direction, (following the direction of arrow (A) FIG. 2 the cam (21) is brought in contact with the corresponding lever (2), by movement of reciprocatable support member (17), copying exactly its angular position, assuming that the second arcuate arms of the levers (1), (2), ("n") have not been moved out of engagement with the pins (1c), (1d), (2c), (2d), ("n"c), ("n"d). If, however, there has been such disengagement, as the actuator (18b) is pushed inwardly, the transverse face of the unlocked cam (21) will engage one end or the other of the second arm of the lever ("n"), or possibly both ends. Since the lever ("n") is free to pivot on its pivot pin ("n"a), and since the transverse bar (5) will have been rotated counterclockwise on pivot pin (4a), and is free to pivot thereon, continued pushing on the actuator (18b) will cause the cam 21 and lever ("n") to rotate relative to each other until both ends of the second arm of lever ("n") are engaged by the cam (21). Thereafter, the rear of the second arm of lever ("n") will be moved towards and engage the pins "n"c and "n"d; the pivot "n"a will thereby move in a generally clockwise manner about the pivot (4a), until the transverse bar (5) is in alignment with lever (6), in which position it is halted by the said engagement of the rear of the second arms of the levers with pins (1c), (1d), (2c), (2d) and "n"c, "n"d. This reestablishes the position of the mechanism, with bar (5) in line with lever (6), and the stems of the levers (4), (1), (2), (n) in parallel. By going on pushing the actuator (18b), the wedge (22) will be brought to its maximum operative position, moving relative to member (17), and will spread the levers (19) and (20) FIGS. 2 and 3 and consequently will lock the cam (21) which will stay secured in such position. Releasing actuator (18b), it will return to a neutral position retaining the position stored by the cam (21), which was sensed by contact with lever (2). To reset bar (5) from any position to a previousld and stored position, the exemplary actuator (18b) is pushed toward bar (5). The pin (1f) fixed on support (17), pulls on the nylon thread (3) and through movement of lever arm (34) will shift the wheel (9) and wheel (10) releasing or de-clutching lever (4) and consequently also bar (5) and arm (6) from the manual control input device (16) and allowing bar (5) to move linearly to the right or to the left according to the prearranged store given by cam (21) described in the storing process. The cam (21), locked in its bar position storing position, will engage the lever (2), causing it to rotate, assuming engagement of one end only of the second arm of lever (2), by cam (21), and if bar (5) is out of alignment with lever (6), causing the above noted movement of lever (2) and bar (5) pivot (4a) until the pins (2c) and (2d) are engaged. The return of actuator (18b) to neutral position is effected by the force of spring (11) through thread (3) on pin (1f); consequently the counter spring (11) will return the wheels (9) and (10), by lever (34) to their initial contact position, and will restore the manual function of input knob (16). The stored position of cam (21) could be cancelled by pulling back actuator (18b) thoroughly, which will return to its outer position (see FIG. 3), releasing levers (19) and (20) from their contrast positions with cam (21). Cam (21) will be free again to rotate and will be ready to be used for other stores.

Practically, the shapes, dimensions, materials and positionings may vary, as susceptible of many substitutions and changes, all of them, though, still in the range of the invention concept.

What is claimed is:

1. A mechanical memory device comprising:
   (a) a transverse bar,
   (b) means supporting said bar for generally transverse movement relative to its longitudinal axis,
   (c) input means for moving said bar to plural selected positions,
   (d) plural means each for defining a distinct position of said bar, each comprising an element pivotally connected to said bar and rotatable relative to said bar upon movement thereof, said elements being spaced along said bar and each said element having engagement means having a distinct position for each position of said bar, and
   (e) plural means for sensing selected positions of said bar, for storing said sensed positions and for actuating said bar to cause it to occupy positions thereof corresponding to said stored positions each comprising means movable transversely to said bar and having means for sensing and storing the position of said engagement means of said element, said sensing and storing means comprising means for engaging said engagement means movably carried by said transversely movable means.

2. The mechanical memory device of claim 1, said element being in a plane substantially parallel to said bar.

3. The mechanical memory device of claim 1, and means for permitting only one of said sensing, storing and actuating means to be moved to a position for sensing the position of a said engagement means of a element.

4. The mechanical memory device of claim 3, and further including means for disengaging said input means from said bar upon movement of a said sensing, storing and actuating means to sense the position of said engagement means of a element.

5. The mechanical memory device of claim 4, said last mentioned means comprising an upstanding pin on each of said means movable transversely to said bar, a flexible member supported for engagement by each said pin upon movement of said pin-carrying means toward said bar, and spring means connected to said flexible member for applying tention thereto.

6. The mechanical memory device of claim 5, said input means comprising a clutch and means on said flexible member for disengaging said clutch upon said movement of a said pin-carrying means toward said bar.

7. The mechanical memory device of claim 1, said means movable transversely to said bar being a reciprocating member movable transversely of said bar, said sensing and storing means being a storing member pivoted on said reciprocating member and having a transverse face positioned for engagement with said engagement means of said element.

8. The mechanical memory device of claim 7, and further comprising means for locking said storing member in the orientation thereof caused by said engagement with said engagement means of said element comprising locking lever means carried by said reciprocating member engageable in one position thereof to lock said storing member and in a second position thereof to release said storing member, and means for moving said locking lever means to said one position subsequent to movement of said reciprocating member causing engagement of said face of said storing member with the engagement means of said element.

9. The mechanical memory device of claim 8, wherein said locking lever means comprises a pair of generally parallel, spaced apart locking levers carried by spaced pivots on said reciprocating member, said storing member having an arcuate face opposite said transverse face thereof, said locking levers having faces engageable with said arcuate face upon spreading of the arms of said locking levers opposite said faces, actuating means carried by and reciprocable relative to said reciprocating member remote from said storing member, and wedge means carried by said actuating means for spreading said arms of said locking levers upon movement of said actuating means on said reciprocating member.

10. The mechanical memory device of claim 1, wherein said element comprises a first arm pivotally connected to said bar, and a second arcuate arm, and fixed guide pins for engaging said arcuate arm.

11. In a mechanical movement memory device wherein a member is movable to a number of selected positions and includes position defining means, plural reciprocating means each for sensing and storing a position of said movable member and for causing said movable member to selectively occupy a position thereof corresponding to a stored position, and wherein said plural means each comprises a reciprocating member and a position storing member pivoted thereon, together with means for locking said storing member in a storing position thereof, the improvement comprising:

locking lever means carried by said reciprocating member engageable in one position thereof to lock said storing member and in a second position thereof to release said storing member, and actuating means carried by said reciprocating member for engaging and moving said locking lever means to said one position subsequent to movement of said reciprocating member causing engagement of said storing means with said position defining means of said movable member.

12. The mechanical movement memory device of claim 11, wherein said locking lever means comprises a pair of generally parallel, spaced apart locking levers carried by spaced pivots on said reciprocating member, said storing member having an arcuate face, said locking levers having faces engageable with said arcuate face upon spreading of the arms of said locking levers opposite said faces; said actuating means carried by said reciprocating member remote from said storing member and reciprocal relative thereto, and wedge means carried by said actuating means for spreading said arms of said locking levers upon movement of said actuating means on said reciprocating member.

13. In a mechanical movement memory device wherein a member is movable to a number of selected positions and includes position defining means, plural reciprocating means each for sensing and storing a position of said movable member and for causing said movable member to selectively occupy a position thereof corresponding to a stored position, and wherein said plural means comprises a reciprocating member, input means for moving said member to a selected position, and clutch means for disengaging said input means from said movable member, and means including flexible cord means for moving a previously actuated reciprocating member to an inactive position upon actuation of another reciprocating member, the improvement comprising means supporting a portion of said flexible cord for axial movement thereof upon actuation of a said reciprocating member, said clutch means comprising an arm adjacent said portion of said cord, and means connecting said cord with said arm of said clutch to move said arm upon axial movement of said portion of said cord.

14. The improvement of claim 13, and a spring attached to said arm and applying tension to said cord.

15. In a mechanical movement push button memory device comprising a plurality of reciprocating means each comprising means for sensing and storing a position, locking lever means carried by said reciprocating means engageable in one position thereof to lock said position sensing and storing means and in a second position thereof to release said position sensing and storing means, and reciprocatable actuator means carried by said reciprocating means and including locking lever engaging means for moving said locking lever means into said one position thereof upon being pushed and for permitting movement of said locking lever means into said second position thereof upon being pulled.

16. The apparatus of claim 15, wherein said reciprocating means is elongage and wherein said actuator means comprises a cap-like element on one end of said reciprocating means.

17. The apparatus of claim 16, wherein said locking lever moving means comprises wedge means carried by said cap-like member.

* * * * *